United States Patent [19]

Aichelmann, Jr. et al.

[11] 4,388,701

[45] Jun. 14, 1983

[54] RECIRCULATING LOOP MEMORY ARRAY HAVING A SHIFT REGISTER BUFFER FOR PARALLEL FETCHING AND STORING

[75] Inventors: Frederick J. Aichelmann, Jr.; Fernando Neves, both of Hopewell Junction, N.Y.

[73] Assignee: International Business Machines Corp., Armonk, N.Y.

[21] Appl. No.: 192,581

[22] Filed: Sep. 30, 1980

[51] Int. Cl.³ .......................... G11C 7/00; G11C 8/00
[52] U.S. Cl. ..................................... 365/77; 365/221; 365/238
[58] Field of Search .................... 365/73, 77, 183, 233, 365/219, 221, 238

[56] References Cited

U.S. PATENT DOCUMENTS

| | | | |
|---|---|---|---|
| 3,760,382 | 9/1973 | Itoh | 365/73 |
| 3,761,695 | 9/1973 | Eichelberger | 235/153 |
| 3,783,254 | 1/1974 | Eichelberger | 235/152 |
| 3,784,907 | 1/1974 | Eichelberger | 324/57 DE |
| 4,128,879 | 12/1978 | Gardner | 365/183 |
| 4,321,694 | 3/1982 | Panigrahi et al. | 365/183 |

FOREIGN PATENT DOCUMENTS 53-21541 2/1978 Japan .................................. 365/77

Primary Examiner—Stuart N. Hecker

[57] ABSTRACT

A recirculating loop memory array is disclosed adapted for the parallel as well as serial fetching and storing of data while requiring only a single input and single output data terminal. Each loop of the array is provided with a shift register stage for parallel data accessing. A particular recirculating bit in all of the loops can be fetched in parallel into their respective shift register stages and, conversely, the bits stored in the shift register stages can be loaded in parallel into predetermined recirculating bits of their respective loops. The shift register is operated at high speed so that it may be completely loaded or unloaded during the interval between successive steppings of the loops.

6 Claims, 2 Drawing Figures

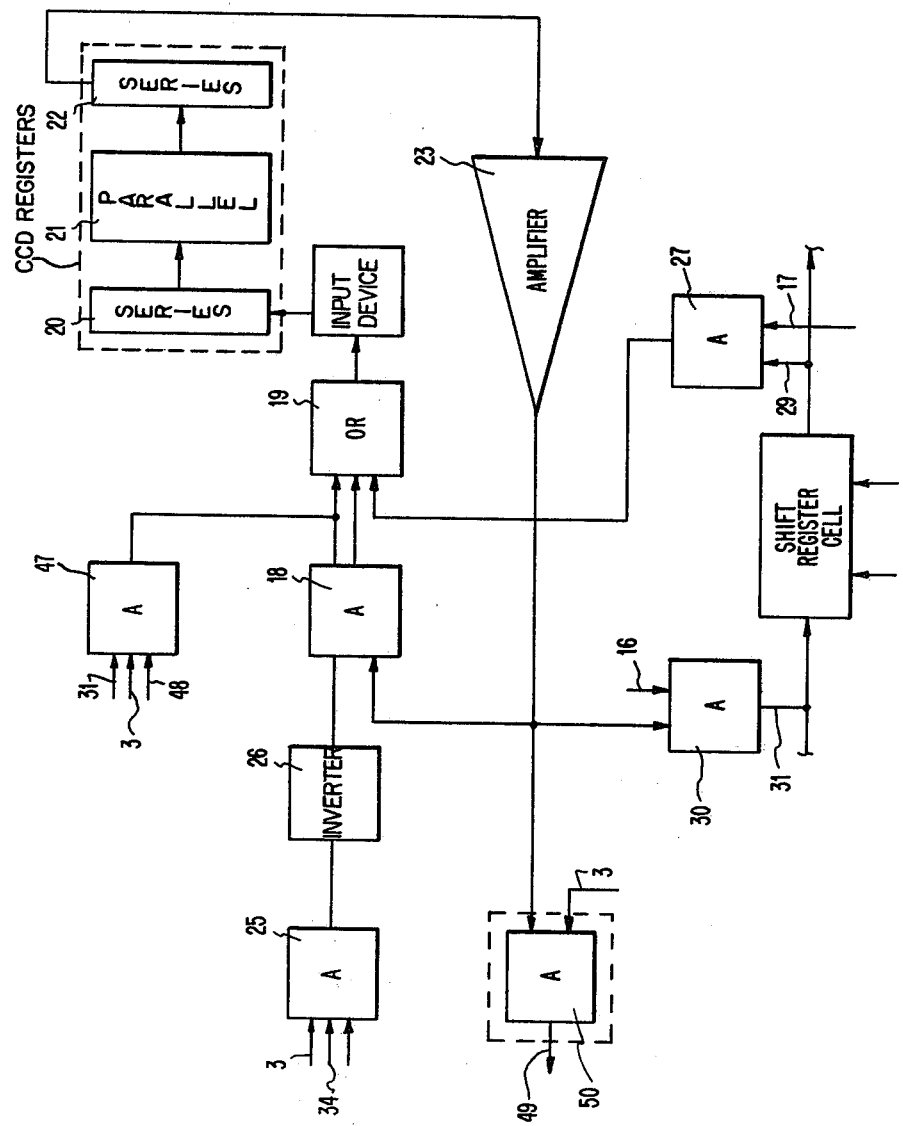

RECIRCULATING LOOP MEMORY ARRAY HAVING A SHIFT REGISTER BUFFER FOR PARALLEL FETCHING AND STORING

BACKGROUND OF THE INVENTION

1. Field of the Invention

The present invention generally relates to means for fetching, and storing data stored in a recirculating loop memory array and, more particularly, to shift register means for accomplishing those functions with speed and economy of structure.

2. Description of the Prior Art

In charge coupled device (CCD) memory arrays, multiple CCD loops are organized so as to be accessible via a single input pin and via a single output pin. Accordingly, the loops are accessed in serial succession. In those cases where the entire array is to be initialized to a predetermined state or tested to verify that the stored data is correct, sufficient time must be allocated to complete the serial accessing of the CCD loops. The required time increases objectionably as the CCD memory array increases in density to include larger numbers of individual loops. Direct parallel accessing of the individual CCD loops, on the other hand, permits much more rapid initialization, but only at the expense of requiring unacceptably large numbers of input-output (I/O) pins.

Indirect parallel accessing of interior logic circuit points has been achieved via I/O pins according to a technique described in U.S. Pat. No. 3,783,254 to E. B. Eichelberger for "Level Sensitive Logic System", issued Jan. 1, 1974 and assigned to the present assignee and in related U.S. Pat. Nos. 3,761,695 and 3,784,907 to the same inventor. Briefly, clocked dc latches are provided at logic network nodes to be tested and additional circuitry is included to selectively connect the latches into a functional shift register. A predetermined pattern of binary ones and zeros can then be introduced serially into the shift register latches where they are retained for later use as parallel inputs to the logic network nodes to be tested. Additional clocked dc latches are provided at other logic network nodes to receive the signals representing the test results produced by the test signals introduced by the first clocked dc latches. Once the test results are stored in the second clocked dc latches, further circuitry connects the latches into a functional shift register which enables the test results to be shifted out. This technique, however, is not well suited for the dynamic testing of data stored within CCD loops within a memory array.

Copending patent application Ser. No. 163,374, now U.S. Pat. No. 4,313,199 for "Recirculating Loop Memory Array Fault Locator", filed June 26, 1980, in the names of F. J. Aichelmann, Jr. et al and assigned to the present assignee, discloses a technique for quickly determining (within designated subdivisions or partitions of recirculating type memory arrays) the locations of faulty bits received from the constituent recirculating type memory elements comprising the array. All loop memory elements are initialized to a predetermined condition for testing purposes by the loading of all loops with the same test data. The stored data is verified by means of a number of comparison gates. A distinctive signal is generated by a given comparison gate in the event that any one or more bits of the data received from one or more of the loops associated with the given comparison gate is non-identical to the data bits from all other associated loops. The output signals produced by the comparison gates are sensed in serial succession to locate the array subdivision containing any faulty elements. In one embodiment of the invention, a latch is provided at the output of each comparison gate. Each latch is set to store the information that one or more bits are faulty from the loops associated with that comparison gate. The latches are then sensed at logic speeds. The latches, however, perform no role in the storing of data within the recirculating loops nor do they participate in the fetching of data from the individual loops.

SUMMARY OF THE INVENTION

Memory arrays of multiple recirculating loop memory elements are buffered for parallel fetching and loading operations by the provision of a shift register comprising a number of shift register cells equal in number to the number of recirculating elements in the array. Each recirculating element or loop is selectively connected to a respective shift register cell so that, on command, a particular recirculating bit in all of the loops can be fetched in parallel into their respective cells and, conversely, so that the bits stored in the shift register cells can be loaded in parallel into predetermined recirculating bits of their respective loops. By first loading all of the shift register cells with binary data, the corresponding bit in each of the recirculating loops can be loaded in parallel by selectively connecting the shift register cells to the recirculating loops. Then, the shift register is reloaded with new binary data and the next bit position in each of the recirculating loops is loaded in similar parallel fashion. This process is repeated until all of the bit positions in the recirculating loops have been loaded.

Data fetching is accomplished in an analogous manner. That is, a given, corresponding bit position in each of the recirculating loops is loaded into a respective shift register cell and then the shift register is emptied of its stored data by shifting. Then, the next bit in all of the recirculating loops is fetched into the respective cells of the shift register and the shift register is emptied as before.

The shift register is operated at logic speeds which are must faster than the bit recirculating rate of the memory loops. Consequently, the entire shift register is loaded in the interval between successive steppings of the bits in the recirculating loops, provided that the number of recirculating loops and, hence, the length of the shift register is not too extensive. In the case of extensive loop arrays, the array can be partitioned into groups of a smaller number of loops with a correspondingly shortened shift register selectively connected to each of the loop groups.

BRIEF DESCRIPTION OF THE DRAWING

FIG. 2 is a simplified block diagram representing in greater detail a typical CCD loop of FIG. 1 and its selective connection to its respective shift register cell.

DESCRIPTION OF THE PREFERRED EMBODIMENT

Figure 1:
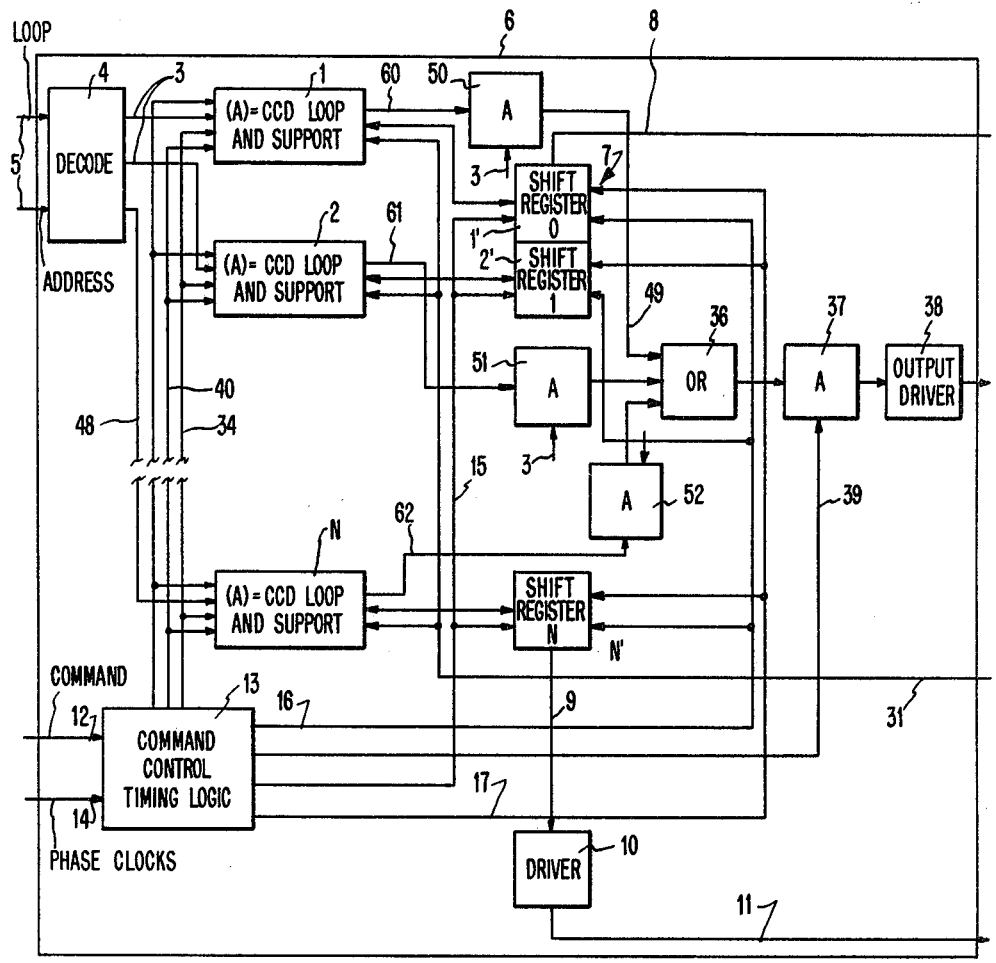
FIG. 1 is a simplified block diagram of a CCD memory array adapted for data fetching, and storing in accordance with the present invention.

The memory array of FIG. 1 comprises a multiplicity of recirculating CCD loops 1, 2 . . . N which preferably are individually addressable for writing and reading purposes associated with the storage of digital data. The loops are individually addressable by respective loop select signals on lines 3 at the outputs of address decode 4. Loop address signals are applied via lines 5 from a source (not shown) located off chip 6 containing the loops. The serial bit outputs from each of the loops 1 through N are selectively applied to a respective shift register cell 1', 2' ... N' comprising shift register 7. Shift register 7 receives digital data from line 8 for the serial loading of the register stages. The data stored at any given time within register 7 can be serially shifted out via line 9 and driver circuit 10 and made available on output line 11. Shift register 7 is employed for the parallel data fetching and for the parallel data loading associated with the handling of data signals as well as test signals with the CCD loop memory array at different times.

Apparatus is also provided for the serial data fetching and the serial data loading of an individually addressed loop. Input data is applied via line 31 in the presence of write commands on lines 34 and 48 supplied by command control 13. Similarly, data stored within any addressed loop is fetched via lines 60, 61 and 62, AND gates 50, 51 and 52, OR gate 36 AND gate 37 (when conducting) and driver 38. Gate 37 is rendered conductive by a read command on line 39.

Command signals for the fetching and storing of data in the array loops are applied by lines 12 to command control timing logic 13. Phase clocks are the control of shift register 7 and the array loops are applied by lines 14 to command control and timing logic 13. The phase clocks are of such frequency and phase to permit the entire shift register 7 to be loaded or unloaded in the time between the stepping of data from one bit position to the next position within each of the recirculating loops. Stepping clocks are applied to loops 1 through N via line 40. Shift clocks are applied to the individual shift register stages via line 15. Parallel read and parallel write commands are applied by lines 16 and 17, respectively, to the individual shift register stages. Parallel read command signals and serial read command signals are applied alternatively to lines 16 and 39, respectively, by command control 13. The same alternative application is made of the parallel write command signals and serial write command signals to lines 17 and 48, respectively.

Referring now to FIG. 2, the typical CCD loop of FIG. 1 comprises AND circuit 18, OR circuit 19, series-parallel-series CCD registers 20, 21 and 22 and regenerative amplifier 23. When there is no write command on line 34 during the read/write enable interval, AND circuit 25 produces a zero output which is inverted (26) to render AND circuit 18 conductive to each of the recirculating data bits. The recirculating loop is broken, by the non conductance of gate 18, upon the appearance of a write command on line 34. A signal appears on line 34 whenever a serial write command occurs on line 48 or a parallel write command occurs on line 17. Input data gate 27 conducts in the simultaneous presence of a respective parallel write command signal on line 17 and input data on line 29. The output of gate 27 is coupled into the loop via OR circuit 19. Data is read out of the recirculating loop via AND gate 30 and line 31 upon application of a parallel read command on line 16 and in the absence of a write command signal on line 34.

Loop data signals are applied to AND gate 50 along with the respective loop selection signal on line 3. The output of gate 50 on line 49 is applied to OR gate 36. Write command signals are applied to AND gate 25 together with the respective loop selection signal on line 3. The serial input data bits are introduced into the loop via line 31 and OR circuit 19. The recirculating bits are blocked, during the writing interval by the non-conduction of gate 18 due to the conduction of gate 25 and the inversion provided by inverter 26, as previously explained.

It can be seen from the preceding specification that provision is made, in accordance with the present invention, for the parallel accessing of any addressed loop for data storage and fetching purposes as well as for the serial accessing of all loops at the same time. In the former instance, one corresponding bit is extracted from each of the loops and is applied to the respective stage of an output shift register. The register is shifted at a high rate so that its contents may be emptied (or filled, as the case may be) in the time interval between successive steppings of the recirculating loop bits. The parallel loop accessing mode is of special importance when utilized either as a high speed storage testing facility or as a cache data buffer. It also provides a paging heirarchy organization whereby data is distributed between all loops rather than within a single loop.

We claim:

1. A memory array comprising,
   a plurality of recirculating loop memory elements,
   said elements being clocked in synchronism so that the corresponding bits recirculate in their respective loops with the same time phase,
   a shift register having a serial data input and a serial data output and comprising a number of cells equal in number to the number of said elements
   a data input line coupled to said input,
   a data output line coupled to said output,
   first means for selectively connecting each said coil to a respective one of said elements for writing data from said cells into said elements,
   second means for selectively connecting each said cell to a respective one of said elements for reading data from said elements into said cells, and
   means for shifting data stored in said shift register throughout said number of cells in the time interval between successive clockings of said elements.

2. The apparatus defined in claim 1 wherein said elements are charge coupled devices.

3. The apparatus defined in claim 1 and further including third means independent of said shift register for writing data into said elements.

4. The apparatus defined in claim 3 and further including means for operating said first and third means alternatively.

5. The apparatus defined in claim 1 and further including fourth means independent of said shift register for reading data from said elements.

6. The apparatus defined in claim 5 and further including means for operating said second and fourth means alternatively.

* * * * *